(12) United States Patent
Afsahi et al.

(10) Patent No.: US 8,665,931 B2
(45) Date of Patent: Mar. 4, 2014

(54) CALIBRATION OF COMMUNICATION PROCESSING PATH

(75) Inventors: Ali Afsahi, San Diego, CA (US); Utku Seckin, La Jolla, CA (US); Colin Fraser, Mountain View, CA (US); Navid Lashkarian, Pleasanton, CA (US); Konrad Kratochwil, Sunnyvale, CA (US); Arya Reza Behzad, Poway, CA (US); Dengwei Fu, Los Altos, CA (US)

(73) Assignee: Broadcom Corporation, Irvine, CA (US)

( * ) Notice: Subject to any disclaimer, the term of this patent is extended or adjusted under 35 U.S.C. 154(b) by 8 days.

(21) Appl. No.: 13/539,175

(22) Filed: Jun. 29, 2012

(65) Prior Publication Data

US 2013/0287076 A1 Oct. 31, 2013

Related U.S. Application Data

(60) Provisional application No. 61/640,585, filed on Apr. 30, 2012.

(51) Int. Cl.
*H04L 5/16* (2006.01)

(52) U.S. Cl.
USPC ........... 375/221; 375/219; 375/295; 375/296; 375/297

(58) Field of Classification Search
USPC ................ 375/221, 219, 295, 296, 297, 316; 330/149, 278
See application file for complete search history.

(56) References Cited

U.S. PATENT DOCUMENTS

| 8,000,661 B2 * | 8/2011 | Chiu et al. ................. 455/114.3 |
| 2007/0153884 A1 * | 7/2007 | Balasubramanian et al. 375/221 |
| 2009/0115513 A1 * | 5/2009 | Hongo et al. ................. 330/149 |
| 2010/0048149 A1 * | 2/2010 | Tang et al. ................. 455/114.3 |

* cited by examiner

*Primary Examiner* — Dhaval Patel
(74) *Attorney, Agent, or Firm* — Garlick & Markison; Randy W. Lacasse

(57) ABSTRACT

Communication processing paths include distortions, such as DC offset in the baseband analog path, local oscillator feed-through distortion, and nonlinearity of gm's and power amplifiers which are calibrated for, separately or in combination. The cascaded DC offset and nonlinear distortions are modeled separately or in combination using even-and-odd order polynomials. A loopback path from the output of one or more distortion causing devices passes through a measurement and calculation module. The calculation module calculates predistortion polynomial's coefficients which will be stored in a look-up table to be used by a baseband predistorter to calibrate the path. The look-up table is stored locally or remotely.

20 Claims, 13 Drawing Sheets

CALIBRATION OF COMMUNICATION PROCESSING PATH

CROSS-REFERENCE TO RELATED APPLICATIONS

The present application claims priority based on 35 USC 119 to the provisionally filed application entitled, COMMUNICATION SYSTEM TRANSCEIVERS, having Ser. No. 61/640,585, filed on Apr. 30, 2012, the contents of which are incorporated herein for any and all purposes, by reference thereto.

BACKGROUND OF THE INVENTION

1. Technical Field of the Invention

This invention relates generally to wireless communication and more particularly to calibration of signal processing paths used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

BRIEF DESCRIPTION OF THE SEVERAL VIEWS OF THE DRAWING(S)

FIG. 1 is a schematic block diagram of an embodiment of a wireless communication system;

FIG. 2 is a schematic block diagram of another embodiment of a wireless communication system;

FIG. 3 is a schematic block diagram of an RF transceiver for a wireless communication system;

FIG. 4 is a schematic block diagram of a simple two antenna MIMO structure;

FIG. 5 illustrates an embodiment of the technology described herein where DC offset may be introduced by the analog path between a digital-to-analog converter (DAC) and a transconductance amplifier (gm amplifier).

FIG. 6 illustrates an embodiment where even-order harmonic distortions are created.

FIG. 7 illustrates an embodiment of the technology described herein where DC offset and nonlinearity may be introduced in multiple locations along the analog path.

FIG. 8 illustrates an embodiment of the technology described herein where predistortion is introduced between a baseband pre-distortion (BBPD) and the gm.

FIG. 9 illustrates an embodiment including a series of calibration steps to correct for DC offset and distortion.

DETAILED DESCRIPTION OF THE INVENTION

Figure 1:
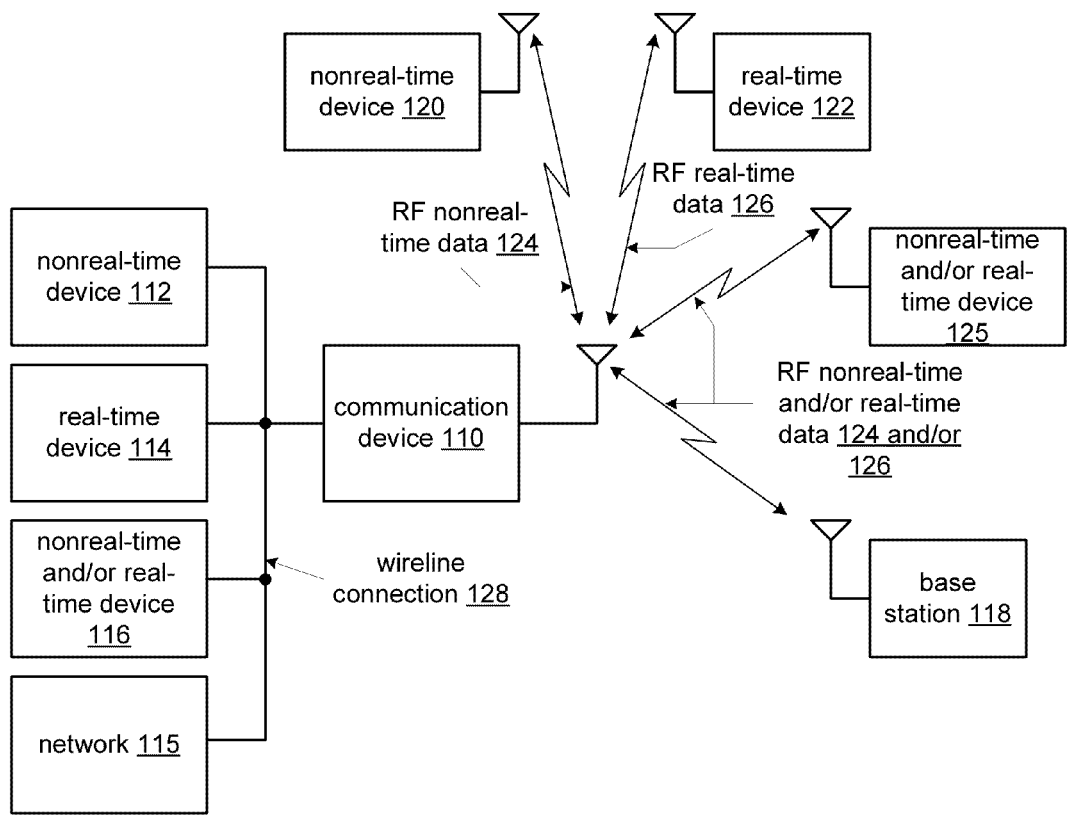

FIG. 1 is a schematic block diagram of a communication system in accordance with the technology described herein. In particular, a communication system is shown that includes a communication device 110 that communicates non-real-time data 124 and/or real-time data 126 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 2-17 that follow.

Figure 2:
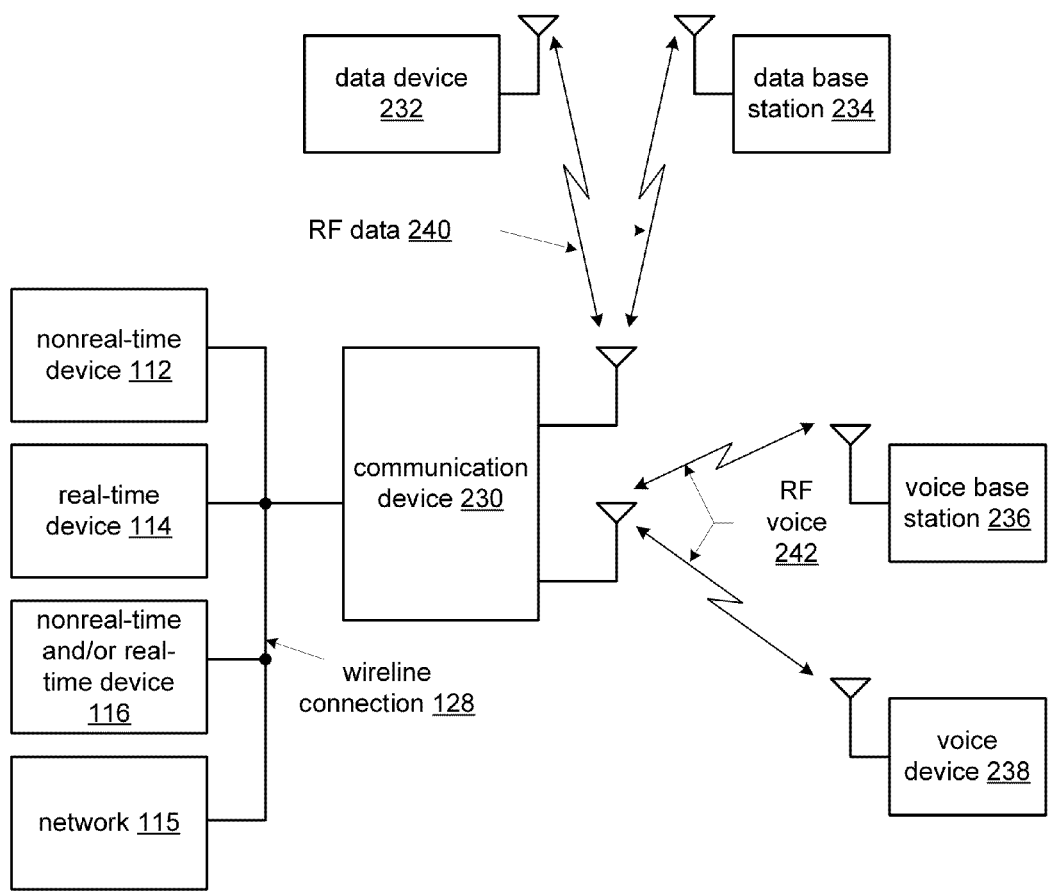

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
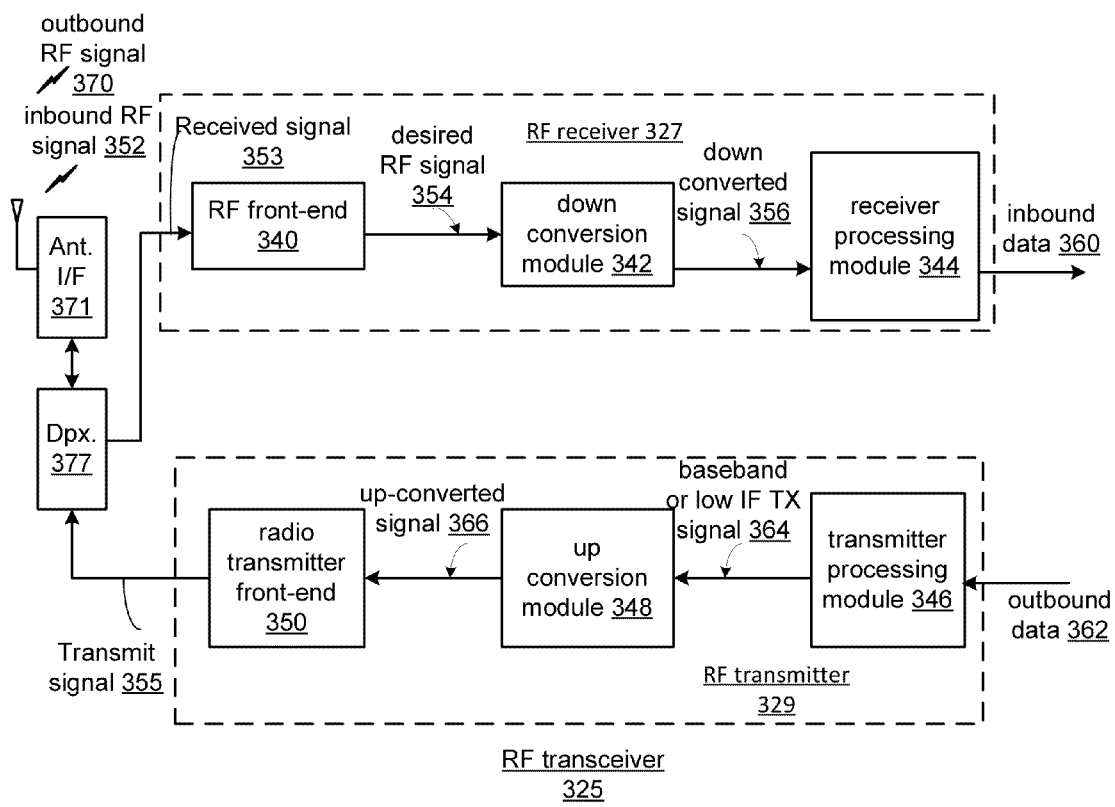

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time/real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
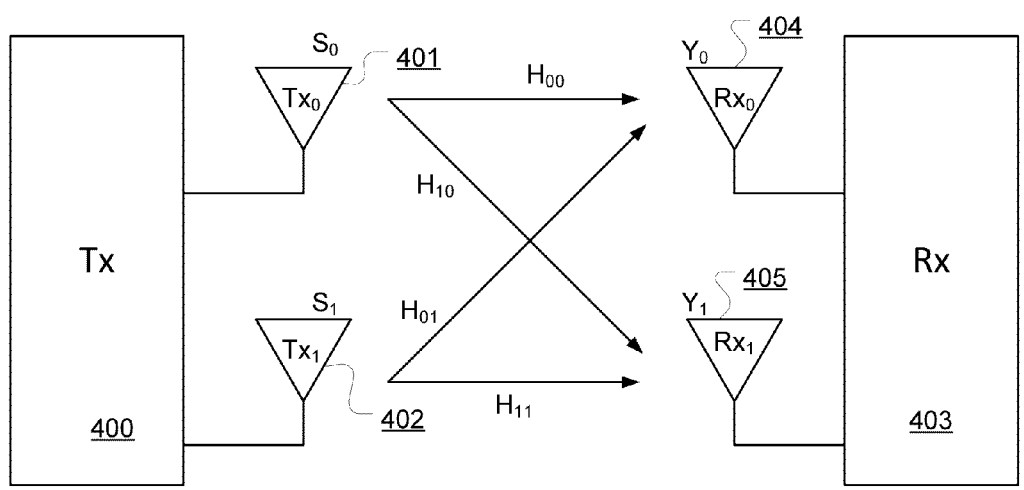

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a down-converted (baseband or low IF) signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, microcomputer, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx\text{-}Rx}$ notation) and the data path is referred to as channel H. While, the example illustrated is a two antenna structure, the embodiments disclosed herein may operate within other known antenna configurations (e.g., 2×4, 2×8, 4×16, etc.)

Further details including optional functions and features of the RF transceiver are discussed in conjunction with FIGS. 5-17 that follow.

As previously shown in FIG. 3, reception and transmission of communication signals includes a multitude of processing stages (e.g., transmitter processing module 346). Within, and between, these stages, signal error is routinely introduced in the form of distortion. Various elements within the processing path (chain) create various distortions such as DC offset in the baseband analog path or non-linearity in amplification stages.

The technical descriptions described herein, in various embodiments, account for and provide calibration for various signal processing path distortion characteristics. More specifically, the calibration reduces the variations of parts, limiting the residual impairment to a specified amount. However, calibration of the signal paths is best served by a better fundamental understanding of the negative signal quality influences created along the path.

Figure 5:
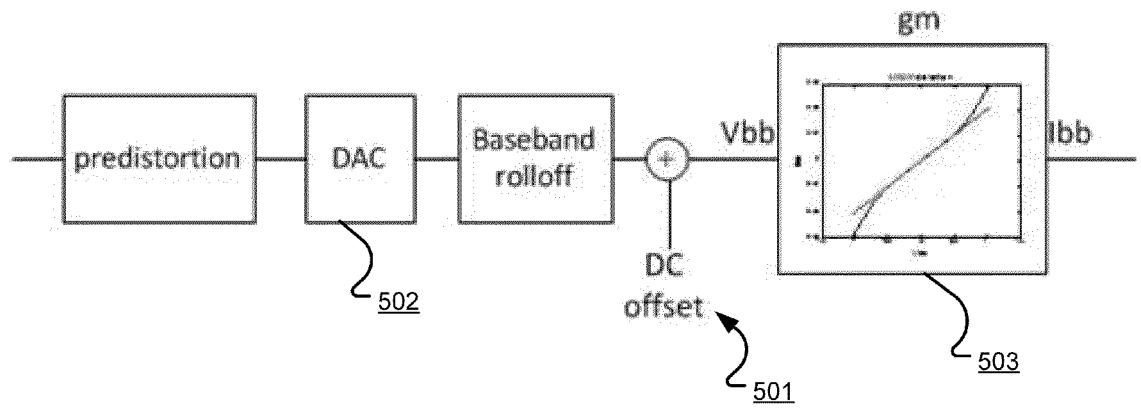

FIG. 5 illustrates an embodiment of the technology described herein where DC offset 501 may be introduced by the analog path between a digital-to-analog converter (DAC) 502 and transconductance amplifier (gm amplifier) 503. When describing a periodic function in the frequency domain, DC offset, or DC coefficient is the mean value of the waveform. In such usage, this coefficient represents the useless DC, while the coefficients representing various other frequencies are analogous to superimposed AC voltages or currents, hence called AC components or AC coefficients. If the mean amplitude is zero, there is no DC offset. DC offset is usually undesirable when it causes saturation or change in the operating point of an amplifier. In order to correct, for example by calibration, DC offset and other distortions created along the analog path, these effects must be recognized and properly modeled.

Figure 6:
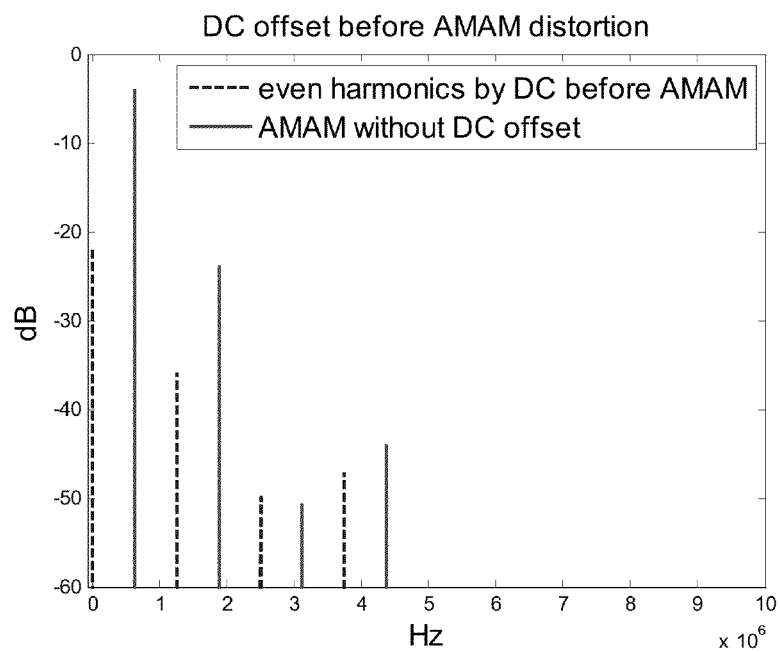

FIG. 6 illustrates a diagram illustrating the effects of the DC offset 501 as shown in FIG. 5, where, even when gm's have only odd-order nonlinearities with DC offset before gm, even-order harmonic distortions are created.

DC offset and nonlinearity are intermodulated. Table 1 below expresses harmonics (fundamental, even and odd) for both fundamental gain compression (AM-AM) only as well as DC+AM-AM. If AM-AM distortion is defined as $I_{bb}=b_1 V_{bb} \times b_3 V_{bb}^3 + b_5 V_{bb}^5 + b_7 V_{bb}^7$ and adding DC offset: $V_{bb}+D$, with $V_{bb}=\cos \omega t$:

converter (DAC) 702 and an analog low-pass filter (ALPF) 703. Second, DC offset 704 may be introduced between the ALPF and the transconductance amplifier (gm amplifier) 705. As shown, DC offset and other odd-order nonlinearities may be introduced by the ALPF and gm. The ALPF and gm's nonlinearities create odd-order harmonics while the local oscillator feed through (LOFT) 706 creates zero-th order distortion when observed before power amplifier (PA) 707.

DC offset intermodulating with odd-order distortions creates even order distortions. To provide joint calibration and cancellation requires modeling both with even-and-odd order polynomials and with DC offset preceding odd-order distortions defined as:

$$b_1(x+D)+b_3(x+D)^3+b_5(x+D)^5$$

expanding the odd-order polynomial with DC offset, the result is a polynomial with both even and odd terms:

$$(b_5 D^5 + b_3 D^3 + b_1 D) + (b_1 + 5b_5 D^4 + 3b_3 D^2)x +$$
$$(3b_3 D + 10 b_5 D^3)x^2 + (b_3 + 10 b_5 D^2)x^3 + 5 b_5 D x^4 + b_5 x^5$$

Table 2 below expresses harmonics (fundamental, even and odd) using a general, even-and-odd order, polynomial:

$$b_0+b_1 x+b_2 x^2+b_3 x^3+b_4 x^4+b_5 x^5+b_6 x^6+b_7 x^7$$

TABLE 1

|      | AMAM Only | DC + AMAM |
|------|-----------|-----------|
| DC   | 0 | $Db_1 + \left(\frac{3}{2}D+D^3\right)b_3 + \left(\frac{15}{8}D+5D^3+D^5\right)b_5 + \left(\frac{35}{16}D+\frac{105}{8}D^3+\frac{21}{2}D^5+D^7\right)b_7$ |
| Fund | $b_1 + \frac{3}{4}b_3 + \frac{5}{8}b_5 + \frac{35}{64}b_7$ | $b_1 + \left(\frac{3}{4}+3D^2\right)b_3 + \left(\frac{5}{8}+\frac{15}{2}D^2+5D^4\right)b_5 + \left(\frac{35}{64}+\frac{105}{8}D^2+\frac{105}{4}D^4+7D^6\right)b_7$ |
| HD2  | 0 | $\frac{3}{2}Db_3 + \left(\frac{5}{2}D+5D^3\right)b_5 + \left(\frac{105}{32}D+\frac{35}{2}D^3+\frac{21}{2}D^5\right)b_7$ |
| HD3  | $\frac{1}{4}b_3 + \frac{5}{16}b_5 + \frac{21}{64}b_7$ | $\frac{1}{4}b_3 + \left(\frac{5}{16}+\frac{5}{2}D^2\right)b_5 + \left(\frac{21}{64}+\frac{105}{16}D^2+\frac{35}{4}D^4\right)b_7$ |
| HD4  | 0 | $\frac{5}{8}Db_5 + \left(\frac{21}{16}D+\frac{35}{8}D^3\right)b_7$ |
| HD5  | $\frac{1}{16}b_5 + \frac{7}{64}b_7$ | $\frac{1}{16}b_5 + \left(\frac{7}{64}+\frac{21}{16}D^2\right)b_7$ |
| HD6  | 0 | $\frac{7}{32}Db_7$ |
| HD7  | $\frac{1}{64}b_7$ | $\frac{1}{64}b_7$ |

From Table 1, even-order harmonics will be 0 if D=0. Using the measured fundamental (Fund), all odd-order harmonic distortions (e.g., HD3,8 HD5, HD7, etc.), and one even-order distortion (e.g., HD2) can be solved for all the coefficients of the polynomial, as well as D.

Figure 7:
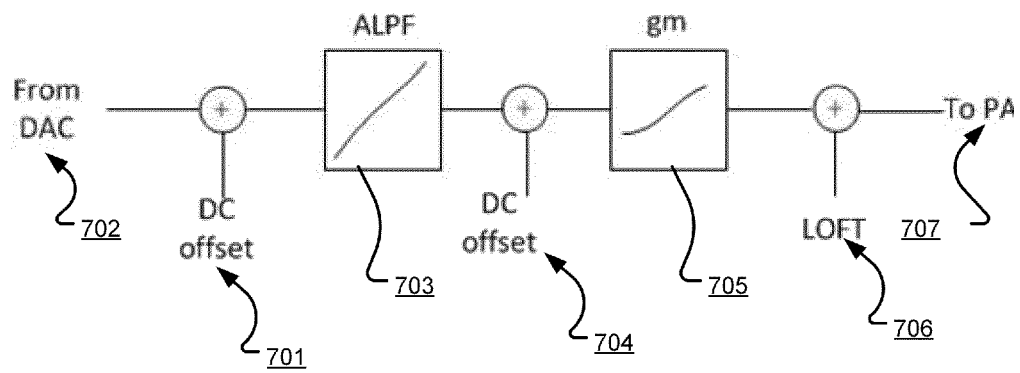

FIG. 7 illustrates an embodiment of the technology described herein where DC offset and nonlinearity may be introduced in multiple locations along the analog path. First, DC offset 701 may be introduced between a digital-to-analog

TABLE 2

| DC | $b_0 + \frac{1}{2}b_2 + \frac{3}{8}b_4 + \frac{5}{16}b_6$ |
|----|-----------|
| Fundamental | $b_1 + \frac{3}{4}b_3 + \frac{5}{8}b_5 + \frac{35}{64}b_7$ |

TABLE 2-continued

| | |
|---|---|
| HD2 | $\frac{1}{2}b_2 + \frac{1}{2}b_4 + \frac{15}{32}b_6$ |
| HD3 | $\frac{1}{4}b_3 + \frac{5}{16}b_5 + \frac{21}{64}b_7$ |
| HD4 | $\frac{1}{8}b_4 + \frac{3}{16}b_6$ |
| HD5 | $\frac{1}{16}b_5 + \frac{7}{64}b_7$ |
| HD6 | $\frac{1}{32}b_6$ |
| HD7 | $\frac{1}{64}b_7$ |

From Table 2, using the measured DC offset, fundamental (Fund) and all odd and even order harmonic distortions (e.g., HD2-HD7, etc.), all coefficients of the polynomial can be solved.

Figure 8:
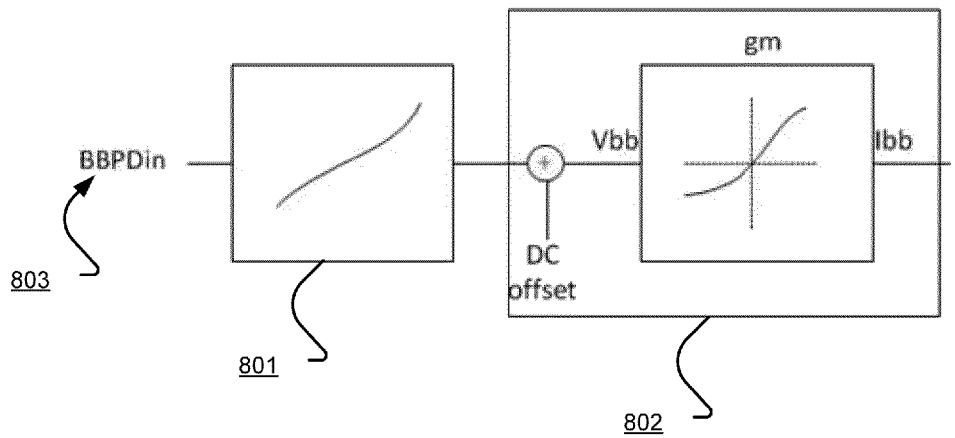

FIG. 8 illustrates an embodiment of the technology described herein where predistortion through predistorter 801 is introduced by the baseband pre-distortion (BBPD) element 803 to compensate the gm 802. To compute the predistortion polynomial, define:

$$x = BBPDin - b_0$$

the predistorter polynomial:

$$a_1 x + a_2 x^2 + a_3 x^3 + a_4 x^4 + a_5 x^5 + a_6 x^6 + a_7 x^7$$

and the impairment (AM-AM+DC) polynomial:

$$b_0 + b_1 x + b_2 x^2 + b_3 x^3 + b_4 x^4 + b_5 x^5 + b_6 x^6 + b_7 x^7$$

The predistorter's polynomial's coefficients are computed from the measured AM-AM+DC's coefficients as:

$$a_1 = \frac{1}{b_1}$$

$$a_2 = -\frac{b_2}{b_1^3}$$

$$a_3 = -\frac{b_1 b_3 - 2b_2^2}{b_1^5}$$

$$a_4 = -\frac{b_4 b_1^2 - 5b_3 b_1 b_2 + 5b_2^3}{b_1^7}$$

$$a_5 = \frac{-b_5 b_1^3 + 6b_4 b_1^2 b_2 + 3b_1^2 b_3^2 - 21b_1 b_2^2 b_3 + 14b_2^4}{b_1^{\wedge}9}$$

$$a_6 = -\frac{b_6 b_1^4 - 7b_5 b_1^3 b_2 - 7b_4 b_1^3 b_3 + 28b_4 b_1^2 b_2^2 + 28b_1^2 b_2 b_3^2 - 84b_1 b_2^3 b_3 + 42b_2^5}{b_1^{11}}$$

$$a_7 = \frac{-b_7 b_1^5 + 8b_6 b_1^4 b_2 + 8b_5 b_1^4 b_3 + 4b_1^4 b_4^2 - 36b_5 b_1^3 b_2^2 - 72b_1^3 b_2 b_3 b_4 - 12b_1^3 b_3^3 + 120b_1^2 b_2^2 b_4 + 180b_1^2 b_2^2 b_3^2 - 330b_1 b_2^4 b_3 + 132b_2^6}{b_1^{13}}$$

Figure 9:
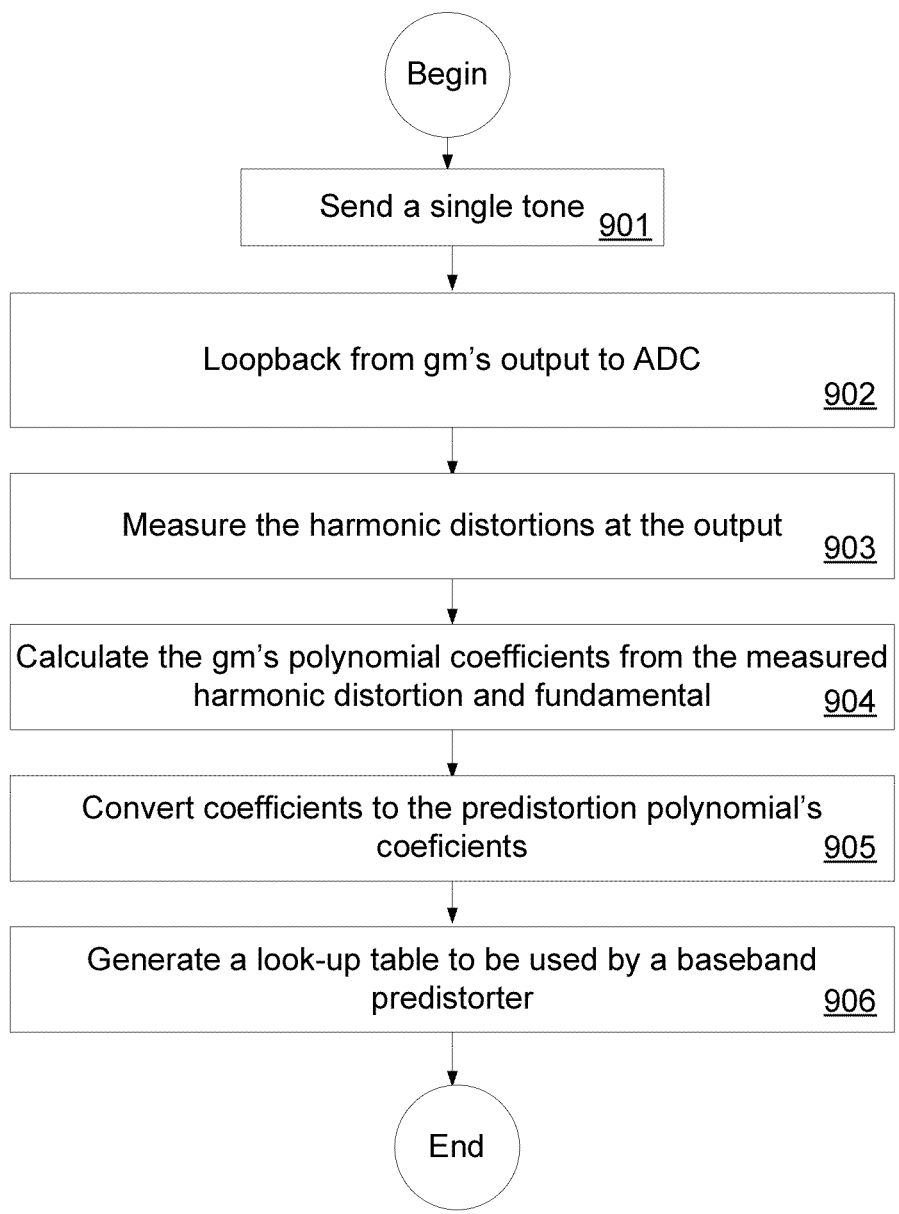

FIG. 9 illustrates an embodiment of the technology described herein which comprises suitable hardware/software in the form of circuitry, logic gates, and/or code that functions to perform a series of calibration steps to correct for the previously described DC offset and distortion as shown FIGS. 5-8. In step 901, a single tone is sent (transmitted) along the analog path. In step 902, the signal (converted to voltage) is looped back from gm's output to an analog to digital converter (ADC). In step 903, the harmonic distortions at an RX FFT output are measured. In step 904, the gm's polynomial coefficients are calculated from the measured HD and the fundamental and converted in step 905 to the predistortion polynomial's coefficients. In step 906, a look-up table is generated using the calculated predistortion polynomial's coefficients to be used by a baseband predistorter.

Figure 10:
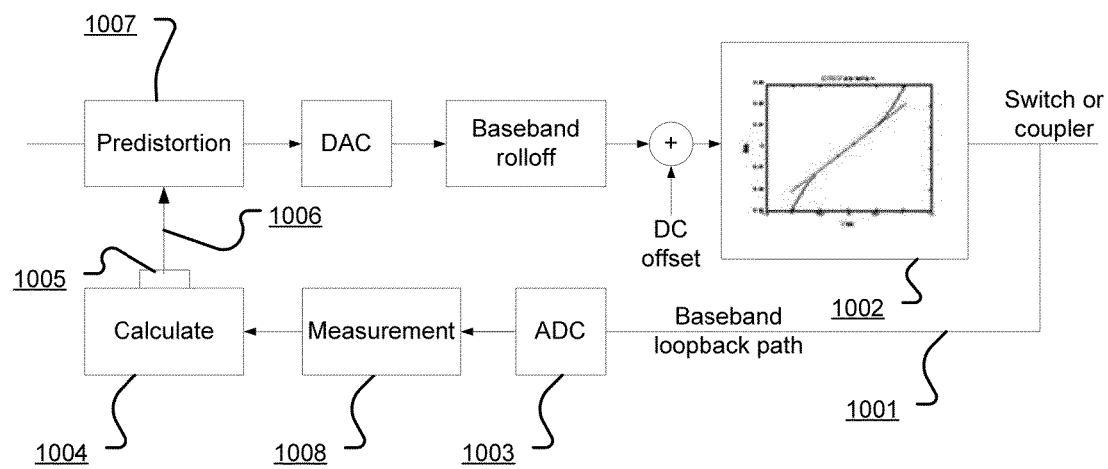
FIG. 10 illustrates an embodiment of the technology described herein that performs the series of calibration steps as described in FIG. 9.

FIG. 10 illustrates an embodiment of the technology described herein which comprises suitable hardware/software in the form of circuitry, logic gates, and/or code that functions to perform a series of calibration steps as described in FIG. 9 to correct for DC offset and distortion. As shown, a baseband loopback path 1001 from the output of the gm 1002 is fed to analog to digital convertor (ADC) 1003 which is fed to measurement module 1008 which passes to calculation module 1004. The calculation module will, using measured DC, fundamental and harmonic distortion frequencies (measurement module 1008), calculate the coefficients of the distortion polynomial, which are then used to calculate calibration predistortion polynomial's coefficients. Calculated calibration predistortion polynomial coefficients are stored in look-up table 1005 to be used as inputs 1006 to the baseband predistorter 1007 to calibrate the path. The look-up table can be stored locally (shown) or remotely (e.g., in cloud storage) and in known or future storage mediums using known or future storage methods. FIG. 10 shows one embodiment for DC offset and gm nonlinearity calibration (correction). However, any one or more sources of distortion, can be substituted, singularly or in combination, without departing from the scope of the instant invention.

In an alternative embodiment of the technology disclosed herein, the DC offset and the gm's AM-AM distortions are calculated separately (where the DC signal is also distorted by the gm's nonlinearity) and stored as separate entries in the look-up storage table or combined as a single entry.

Figure 11:
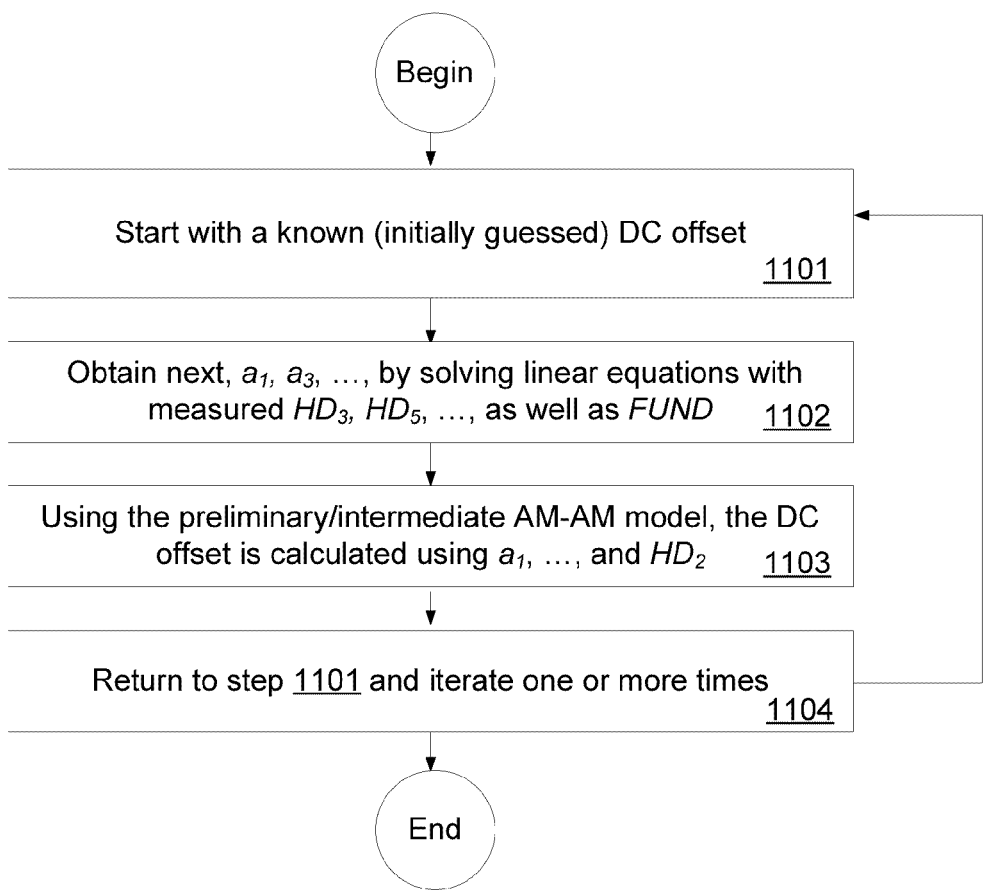
FIG. 11 illustrates an embodiment of the technology described herein comprising a series of calibration steps to jointly calibrate the DC offset and AM-AM distortions.

FIG. 11 illustrates an embodiment of the technology described herein which comprises suitable hardware/software in the form of circuitry, logic gates, and/or code that functions to perform a series of calibration steps to jointly calibrate the DC offset and AM-AM distortions. The objective is to solve both DC and the AM-AM's polynomial coefficients simultaneously where measured harmonics (HDs) can be expressed in $a_1, a_3, \ldots$, and in D. However, these are nonlinear equations and therefore directly solving the equations in $a_1$ and D may be difficult as evidenced by:

$$a_1 + \left(\frac{3}{4} + 3D^2\right)a_3 + \left(\frac{5}{8} + \frac{15}{2}D^2 + 5D^4\right)a_5 + \left(\frac{35}{64} + \frac{105}{8}D^2 + \frac{105}{4}D^4 + 7D^6\right)a_7 = FUND$$

$$\frac{3}{2}Da_3 + \left(\frac{5}{2}D + 5D^3\right)a_5 + \left(\frac{105}{32}D + \frac{35}{2}D^3 + \frac{21}{2}D^5\right)a_7 = HD_2$$

$$\frac{1}{4}a_3 + \left(\frac{5}{16} + \frac{5}{2}D^2\right)a_5 + \left(\frac{21}{64} + \frac{105}{16}D^2 + \frac{35}{4}D^4\right)a_7 = HD_3$$

$$\frac{1}{16}a_5 + \left(\frac{7}{64} + \frac{21}{16}D^2\right)a_7 = HD_5$$

$$\frac{1}{64}a_7 = HD_7$$

The calibration is shown in steps 1101-1104, which iteratively calibrate for DC offset and gm's AM-AM distortions. In step 1101, start with a known (initially guessed (e.g., 0) DC offset. The equations are now linear in $a_1, a_3, \ldots$, and are solved for in step 1102 with measured $HD_3, HD_5, \ldots$, as well as FUND. With this preliminary/intermediate AM-AM model, the DC offset is calculated in step 1103 using $a_1, \ldots$, and $HD_2$. This equation is nonlinear, but has only a single, unknown, variable to solve. The process steps are iterated one or more times in step 1104. As with the previous calibration sequence, the calculated distortions are stored as separate entries in the look-up storage table or combined in a single entry.

Figure 12:
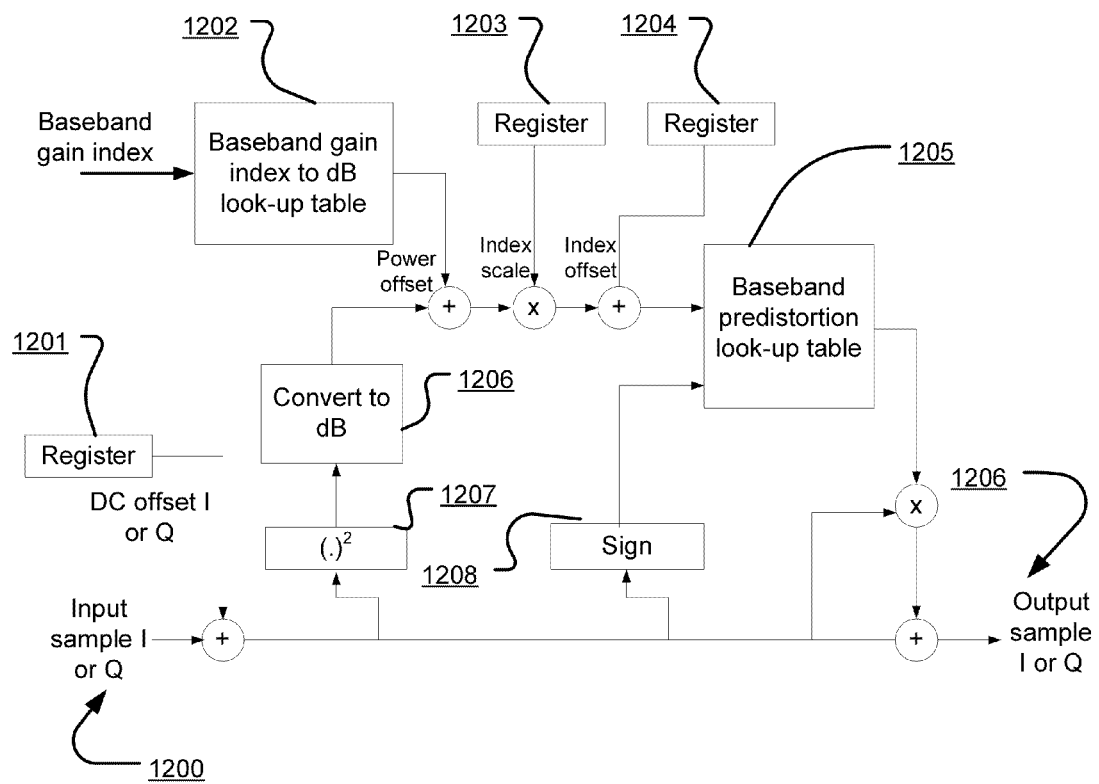
FIG. 12 illustrates an embodiment of the technology described herein that functions as a baseband predistortion transmitter chain to correct for DC offset and distortion.

FIG. 12 illustrates an embodiment of the technology described herein which comprises suitable hardware/software in the form of circuitry, logic gates, and/or code that functions to determine predistortion scale-factors from values of I or Q input samples. First, DC offsets 1201 are added to the input I and Q samples. This, then, is squared 1207 and converted to dB 1206. An offset 1202, based on the baseband gain index, is added to this result, before it is multiplied by a scale-factor 1203. After this, another offset 1204 is applied to the result to produce the final index stored in baseband predistortion lookup table 1205. The output of the lookup table, using the sign 1208 of the input sample, is multiplied 1206 by input I and Q samples, introducing predistortions into these samples.

Figure 13:
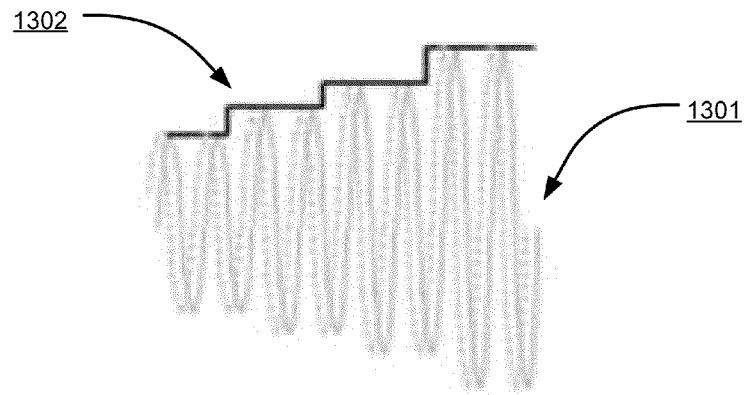
FIG. 13 illustrates an embodiment of the technology described herein that functions to illustrate non-linear amplification.

Various embodiments have been described to improve the processing chain for various distortions. Another area of concern is the non-linearity of the power amplifier (PA) itself, typically integrated within the radio transmitter front-end 350 for amplifying RF signals to be transmitted over antenna structures. As previously shown in FIG. 7, signals output from the Gm are advanced to the PA. FIG. 13 illustrates an example power amplifier gain with nonlinear increase. As shown, as the signal 1301 is increased, the signal rises in incremental nonlinear steps 1302. To calibrate the PA, an understanding of a model for the PA's nonlinearity is needed.

In the RF domain:

$$\hat{I}+j\hat{Q}=(I+jQ)((a_1+jb_1)+(a_3+jb_3)(I^2+Q^2)+(a_5+jb_5)(I^2+Q^2)^2+(a_7+jb_7)(I^2+Q^2)^3+\ldots)$$

With AM-AM only, it is:

$$\hat{I}+j\hat{Q}=(I+jQ)(a_1+a_3(I^2+Q^2)+a_5(I^2+Q^2)^2+a_7(I^2+Q^2)^3+\ldots)$$

It can be written to depend only on the amplitude of (I+jQ), as:

$$\hat{I}+j\hat{Q}=(I+jQ)(a_1+a_3|I+jQ|^2+a_5|I+jQ|^4+a_7|I+jQ|^6+\ldots)$$

Figure 14:
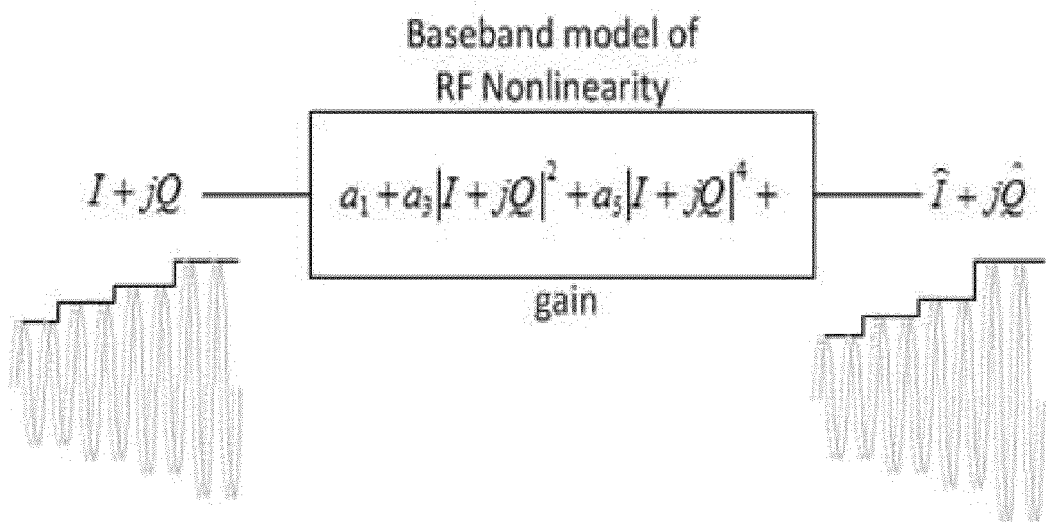
FIG. 14 illustrates an embodiment of the technology described herein that functions to illustrate a baseband model of RF non-linear gain.

Thus the baseband model of RF nonlinearity gain is shown in FIG. 14. A single, complex tone, constant over time, produces a gain of:

$$a_1+a_3|I+jQ|^2+a_5|I+jQ|^4+$$

Figure 15:
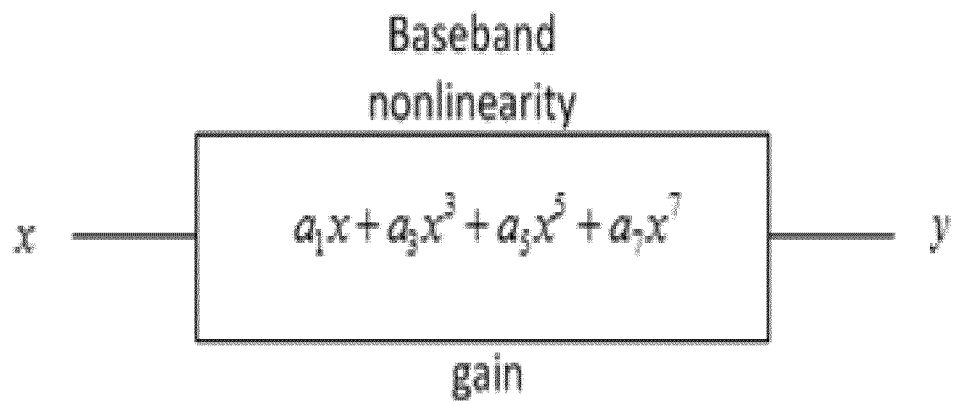
FIG. 15 illustrates an embodiment of the technology described herein that functions to illustrate baseband non-linear gain.

The parameters of nonlinearity, $a_1, a_3, \ldots$ can be determined by (sweeping) the amplitude of a single complex test tone. The baseband nonlinearity gain is shown in FIG. 15 as $a_1 x + a_3 x^3 + a_5 x^5 + a_7 x^7$. With a single tone output, $x = A\cos(t)$, its output is:

$$y = \left(a_1 A + a_3 \frac{3}{4} A^3 + a_5 \frac{5}{8} A^5 + a_7 \frac{35}{64} A^7\right)\cos(t) = FUND$$

$$+ \left(a_3 \frac{1}{4} A^3 + a_5 \frac{5}{16} A^5 + a_7 \frac{21}{64} A^7\right)\cos(3t) = HD3$$

$$+ \left(a_5 \frac{1}{16} A^5 + a_7 \frac{7}{64} A^7\right)\cos(5t) = HD5$$

$$+ \left(a_7 \frac{1}{64} A^7\right)\cos(7t) = HD7$$

Summing the fundamental and all harmonics, it follows:

$$a_1 A + a_3 \frac{3}{4} A^3 + a_5 \frac{5}{8} A^5 + a_7 \frac{35}{64} A^7 = Fund$$
$$a_3 \frac{1}{4} A^3 + a_5 \frac{5}{16} A^5 + a_7 \frac{21}{64} A^7 = HD3$$
$$a_5 \frac{1}{16} A^5 + a_7 \frac{7}{64} A^7 = HD5$$
$$a_7 \frac{1}{64} A^7 = HD7$$
$$\overline{a_1 A + a_3 A^3 + a_5 A^5 + a_7 A^7 = Intgr}$$

Hence, the sum of the fundamental and all harmonics gives the peak amplitude of the AM-AM-distorted signal, given a single-tone input signal. The mapping of the peak amplitude of each input, single-tone signal to the peak amplitude of the output, distorted signal fully characterizes the AM-AM distortion.

Figure 16:
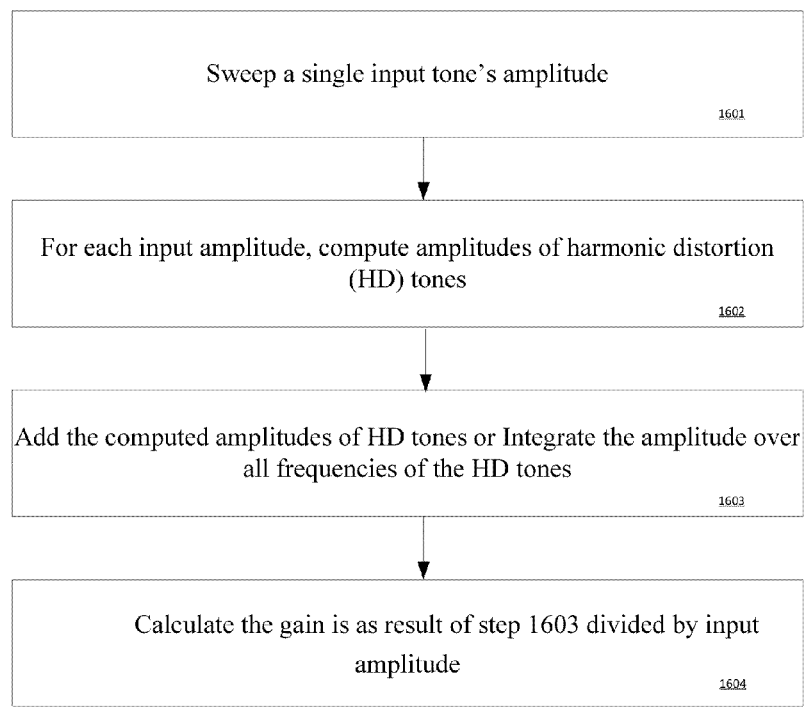
FIG. 16 illustrates an embodiment including a series of calibration steps to correct for non-linear gain in the time domain.

FIG. 16 illustrates one embodiment of a method for calibration of the baseband nonlinearities in the time domain. As shown, in step 1601, a single input tone's amplitude is swept. In step 1602, for each input amplitude, compute amplitudes of harmonic distortion (HD) tones. In step 1603, the amplitudes of all measured HD tones are added or the amplitude over all frequencies of the HD tones is integrated. In step 1604, the gain is calculated as result of step 1603 divided by input amplitude. As with the previous calibration sequences, the calculated distortions are stored as separate entries in the look-up storage table or combined in a single entry.

Figure 17:
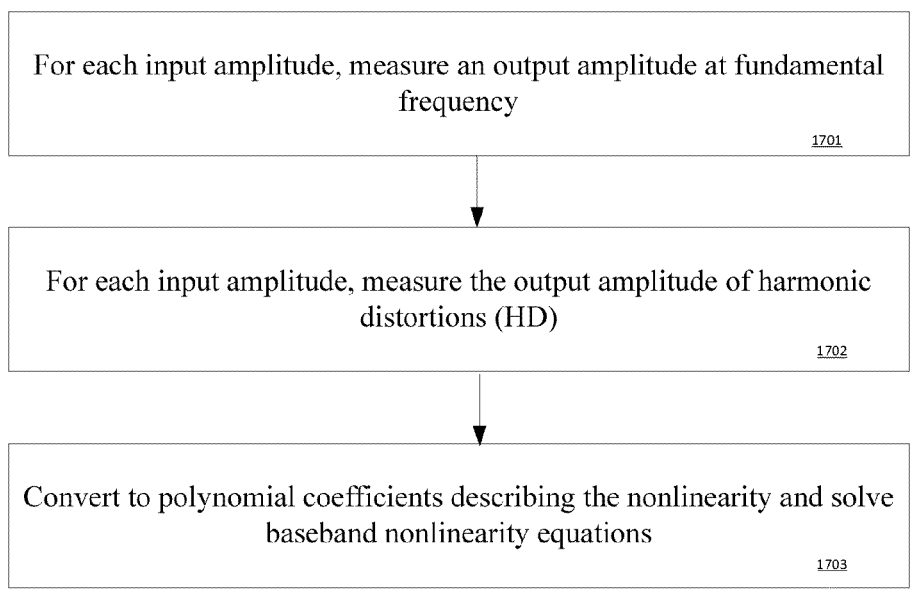
FIG. 17 illustrates an embodiment including a series of calibration steps to correct for non-linear gain in the frequency domain.

FIG. 17 illustrates another embodiment of a method for calibration of the baseband nonlinearities in the frequency domain. In the frequency domain, there is no need to sweep the single tone's output as the swing of the output current, given a single input tone, sufficiently characterizes the AM-AM. An FFT engine, correlators, or equivalents thereof can be used for amplitude extraction in the following method. As shown, in step 1701, for each input amplitude, measure an output amplitude at fundamental frequency. In step 1702, for each input amplitude measure the output amplitude of harmonic distortions (HD). In step 1703, convert to polynomial coefficients describing the nonlinearity and solve the following equations:

$$a_1 A + a_3 \frac{3}{4} A^3 + a_5 \frac{5}{8} A^5 + a_7 \frac{35}{64} A^7 = Fund$$
$$a_3 \frac{1}{4} A^3 + a_5 \frac{5}{16} A^5 + a_7 \frac{21}{64} A^7 = HD3$$
$$a_5 \frac{1}{16} A^5 + a_7 \frac{7}{64} A^7 = HD5$$
$$a_7 \frac{1}{64} A^7 = HD7$$

As with the previous calibration sequence, the calculated distortions are stored as separate entries in the look-up storage table or combined in a single entry.

As shown by various embodiments of the technology described herein, various distortions, such as, but not limited to, DC offset in the baseband analog path, gm's nonlinearity, and power amplifier nonlinearity, can be calibrated, separately or in combination. The cascaded DC offset and nonlinear distortions can be modeled together using even-and-odd order polynomials, though there may be more parameters than independent equations when solving for the parameters, resulting in an "infinite" number of solutions.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A communications processing path calibrator comprising:
   a measuring module, the measured module measuring distortion characteristics of one or more sources of distortion within the communications processing path, wherein the one or more sources of distortion include at least DC offset;
   a calculation module, the calculation module calculating coefficients of a distortion polynomial representing the measured distortion characteristics and thereafter using the calculated coefficients of the distortion polynomial to calculate predistortion polynomial coefficients;
   a look-up table storing as entries the predistortion polynomial coefficients, and
   a predistorter using the entries to calibrate the communications processing path.

2. A communications processing path calibrator, as per claim 1, wherein the one or more sources of distortion further comprises nonlinearity.

3. A communications processing path calibrator, as per claim 1, wherein the distortion characteristics comprise one or more of: a measurement of the DC offset, fundamental, and odd and even order harmonic distortions.

4. A communications processing path calibrator, as per claim 1, wherein the distortion characteristics result from the DC offset and/or nonlinearities introduced by one or more of: analog low-pass filters (ALPF), baseband pre-distortion (BBPD), local oscillators, gm devices and amplifier devices located within the communications processing path.

5. A communications processing path calibrator, as per claim 4, wherein the measurement module further comprises an FFT engine or correlator for amplitude extraction of amplifier device outputs to establish the measured distortion characteristics.

6. A communications processing path calibrator, as per claim 1, wherein the distortion polynomial representing the measured distortion characteristics is modeled as an even-and-odd order polynomial.

7. A communications processing path calibrator, as per claim 1, wherein the calculation module, calculates coefficients of distortion polynomials representing a plurality of measured distortion characteristics.

8. A communications processing path calibrator, as per claim 1, wherein the calculation module, separately calculates coefficients of distortion polynomials each representing a single measured distortion characteristic of a plurality of measured distortion characteristics and thereafter uses the separately calculated coefficients of the distortion polynomial to calculate separate predistortion polynomial coefficients for each single measured distortion characteristic.

9. A communications processing path calibrator, as per claim 1, wherein the look-up table is stored locally or remotely.

10. A communications processing path calibrator, as per claim 1, wherein the communications processing path calibrator is operative in any of: a transmitter, transceiver, user equipment transceiver, base station transceiver, LTE transceiver or MIMO transceiver.

11. A method for communications processing path calibration comprising:
   transmitting a single tone across the communications processing path;
   measuring distortion characteristics of one or more sources of distortion within the communications processing path for the transmitted single tone;
   calculating coefficients of a distortion polynomial representing the measured distortion characteristics and thereafter using the calculated coefficients of the distortion polynomial to calculate predistortion polynomial coefficients;
   storing as entries in a look-up table the calculated predistortion polynomial coefficients, and
   calibrating the communications processing path using the entries as inputs to a predistorter located within the communications processing path.

12. A method for communications processing path calibration, as per claim 11, wherein the distortion characteristics comprise one or more of: DC offset and nonlinearity.

13. A method for communications processing path calibration, as per claim 11, wherein the distortion characteristics comprise one or more of: measured DC offset, fundamental, and odd and even order harmonic distortions.

14. A method for communications processing path calibration, as per claim 11, wherein the distortion characteristics result from DC offset and/or nonlinearities introduced by one or more of: analog low-pass filters (ALPF), baseband pre-distortion (BBPD), local oscillators, gm devices and amplifier devices located within the communications processing path.

15. A method for communications processing path calibration, as per claim 11, wherein the calculating step further comprises calculating coefficients of distortion polynomials representing a plurality of the measured distortion characteristics.

16. A method for communications processing path calibration, as per claim 11, wherein the calculating step further comprises separately calculating coefficients of distortion polynomials each representing a single measured distortion characteristic of a plurality of measured distortion characteristics and thereafter using the separately calculated coefficients of the distortion polynomial to calculate separate predistortion polynomial coefficients for each single measured distortion characteristic.

17. A method for communications processing path calibration, as per claim 11, wherein the distortion polynomial representing the measured distortion characteristics is modeled as an even-and-odd order polynomial.

18. A method for communications processing path calibration, as per claim 11, wherein the one or more sources of distortion within the communications processing path comprises at least a power amplifier and the distortion characteristics comprise nonlinearities of the power amplifier calculated in time domain by the steps:
   sweeping an amplitude of the single tone input to the communications processing path;
   for each amplitude input, computing output amplitudes of harmonic distortion tones;
   adding the computed output amplitudes of tones or integrating the amplitudes over all frequencies of the fundamental and harmonic distortion tones to produce an amplitude value, and
   calculating gain by division of the amplitude value by the input amplitude.

19. A method for communications processing path calibration, as per claim 11, wherein the communications processing path calibration is operative in any of: a transmitter, transceiver, user equipment transceiver, base station transceiver, LTE transceiver or MIMO transceiver.

20. A method for communications processing path calibration, the method comprising the steps of:
   a) estimating DC offset present within the communications processing path;
   b) measuring and modeling distortion characteristics of one or more sources of distortion within the communications processing path using the estimated DC offset;
   c) calculating actual DC offset using the measured and modeled distortion characteristics;
   d) repeating, steps a-c one or more times;
   e) calculating coefficients of a distortion polynomial representing the modeled distortion characteristics and thereafter using the calculated coefficients of the distortion polynomial to calculate predistortion polynomial coefficients;
   f) storing as entries in a look-up table the calculated predistortion polynomial coefficients, and
   g) using the entries to calibrate the communications processing path.

* * * * *

UNITED STATES PATENT AND TRADEMARK OFFICE
CERTIFICATE OF CORRECTION

PATENT NO. : 8,665,931 B2  
APPLICATION NO. : 13/539175  
DATED : March 4, 2014  
INVENTOR(S) : Ali Afsahi et al.

Page 1 of 1

It is certified that error appears in the above-identified patent and that said Letters Patent is hereby corrected as shown below:

In the Claims

Col. 17, line 19, in claim 20: after "coefficients" delete "," and insert --;--

Signed and Sealed this
Thirty-first Day of March, 2015

Michelle K. Lee
*Director of the United States Patent and Trademark Office*